(12) United States Patent
Hentschel et al.

(10) Patent No.: US 8,718,456 B2
(45) Date of Patent: May 6, 2014

(54) SURFACE HEATING DEVICE FOR A SUBSTRATE TREATMENT DEVICE AND SUBSTRATE TREATMENT DEVICE

(75) Inventors: Michael Hentschel, Dresden (DE); Thomas Meyer, Dresden (DE); Hubertus Von Der Waybrink, Dresden (DE); Marco Kenne, Dresden (DE); Daniel Stange, Dresden (DE); Hans-Christian Hecht, Weinboehla (DE)

(73) Assignee: Von Ardenne Anlagentechnik GmbH, Dresden (DE)

( * ) Notice: Subject to any disclaimer, the term of this patent is extended or adjusted under 35 U.S.C. 154(b) by 158 days.

(21) Appl. No.: 13/119,121

(22) PCT Filed: Aug. 23, 2010

(86) PCT No.: PCT/EP2010/062264
§ 371 (c)(1),
(2), (4) Date: May 24, 2011

(87) PCT Pub. No.: WO2011/020924
PCT Pub. Date: Feb. 24, 2011

(65) Prior Publication Data
US 2012/0281975 A1 Nov. 8, 2012

(30) Foreign Application Priority Data
Aug. 21, 2009 (DE) .......................... 10 2009 038 341

(51) Int. Cl.
*F26B 19/00* (2006.01)
(52) U.S. Cl.
USPC ........... 392/416; 392/407; 219/538; 219/544; 219/552

(58) Field of Classification Search
None
See application file for complete search history.

(56) References Cited

U.S. PATENT DOCUMENTS

| 2,483,839 | A |   | 10/1949 | Oakley et al. |
| 2,831,909 | A | * | 4/1958 | Seifert .......................... 373/112 |
| 3,102,185 | A | * | 8/1963 | Boyd et al. ..................... 392/350 |
| 3,446,491 | A | * | 5/1969 | Hill et al. ....................... 432/122 |
| 3,673,385 | A | * | 6/1972 | Drugmand et al. ........... 392/500 |
| 3,693,536 | A | * | 9/1972 | Carville et al. ................. 99/386 |
| 3,785,778 | A | * | 1/1974 | Burstein et al. ............... 422/171 |

(Continued)

FOREIGN PATENT DOCUMENTS

| DE | 2358799 | 9/1974 |
| DE | 2916846 C2 | 10/1980 |

(Continued)

OTHER PUBLICATIONS

International Search Report for PCT/EP2010/062264 dated Oct. 25, 2010.

*Primary Examiner* — Thor Campbell
(74) *Attorney, Agent, or Firm* — Heslin Rothenberg Farley & Mesiti P.C.; Victor A. Cardona, Esq.

(57) ABSTRACT

A surface heating device for a substrate treatment device with increased power density and improved homogeneity of heat radiation includes a jacket tube heater with straight tube sections and bent tube sections in which straight tube sections are arranged parallel to each other in a main plane and straight tube sections are connected to each other by bent tube sections, so that at least part of the bent tube sections are aligned sloped relative to the main plane.

18 Claims, 6 Drawing Sheets

(56) References Cited

U.S. PATENT DOCUMENTS

| | | | |
|---|---|---|---|
| 4,079,921 A | | 3/1978 | Iszczukiewicz |
| 4,238,669 A | * | 12/1980 | Huntley ........................ 219/405 |
| RE30,838 E | * | 12/1981 | Best .............................. 219/550 |
| D266,414 S | * | 10/1982 | Brent ........................... D23/417 |
| 4,571,486 A | * | 2/1986 | Arai et al. ..................... 438/799 |
| 4,626,667 A | * | 12/1986 | Asano .......................... 219/542 |
| 4,756,091 A | * | 7/1988 | Van Denend .................. 34/266 |
| 4,793,283 A | * | 12/1988 | Sarkozy ........................ 118/725 |
| 4,795,885 A | * | 1/1989 | Driggers et al. ............... 219/534 |
| 5,083,012 A | * | 1/1992 | Edwards ........................ 219/553 |
| 5,180,096 A | * | 1/1993 | Kondo ........................ 228/180.1 |
| 5,291,742 A | * | 3/1994 | Kawatani et al. ................. 62/78 |
| 5,473,141 A | * | 12/1995 | Makris et al. ................. 219/544 |
| D378,402 S | * | 3/1997 | Ahmady et al. ............. D23/330 |
| 5,786,569 A | * | 7/1998 | Westerberg ................... 219/411 |
| 6,097,003 A | * | 8/2000 | Markum et al. .............. 219/402 |
| 6,157,002 A | * | 12/2000 | Schjerven et al. ............. 219/388 |
| 6,359,262 B1 | * | 3/2002 | Robertson et al. ............ 219/407 |
| 6,470,239 B1 | * | 10/2002 | Schultz et al. ................ 700/299 |
| 6,723,968 B2 | * | 4/2004 | Danko et al. .................. 219/536 |
| 6,858,819 B2 | * | 2/2005 | McWilliams .................. 219/409 |
| 6,998,578 B2 | * | 2/2006 | Tsuji et al. .................... 219/388 |
| 7,498,544 B2 | * | 3/2009 | Saijo et al. .................... 219/402 |
| 7,514,650 B2 | * | 4/2009 | Melgaard et al. ............. 219/388 |
| 8,188,408 B2 | * | 5/2012 | Claesson et al. .............. 219/388 |
| 8,295,691 B2 | * | 10/2012 | Kusuda ......................... 392/418 |
| 2003/0102301 A1 | * | 6/2003 | Sherrill et al. ................ 219/536 |
| 2011/0079218 A1 | * | 4/2011 | Wortman et al. ............. 126/91 A |

FOREIGN PATENT DOCUMENTS

| | | |
|---|---|---|
| DE | 3619919 A1 | 1/1988 |
| JP | 09236268 A | 9/1997 |
| WO | 2009070144 A1 | 6/2009 |

* cited by examiner

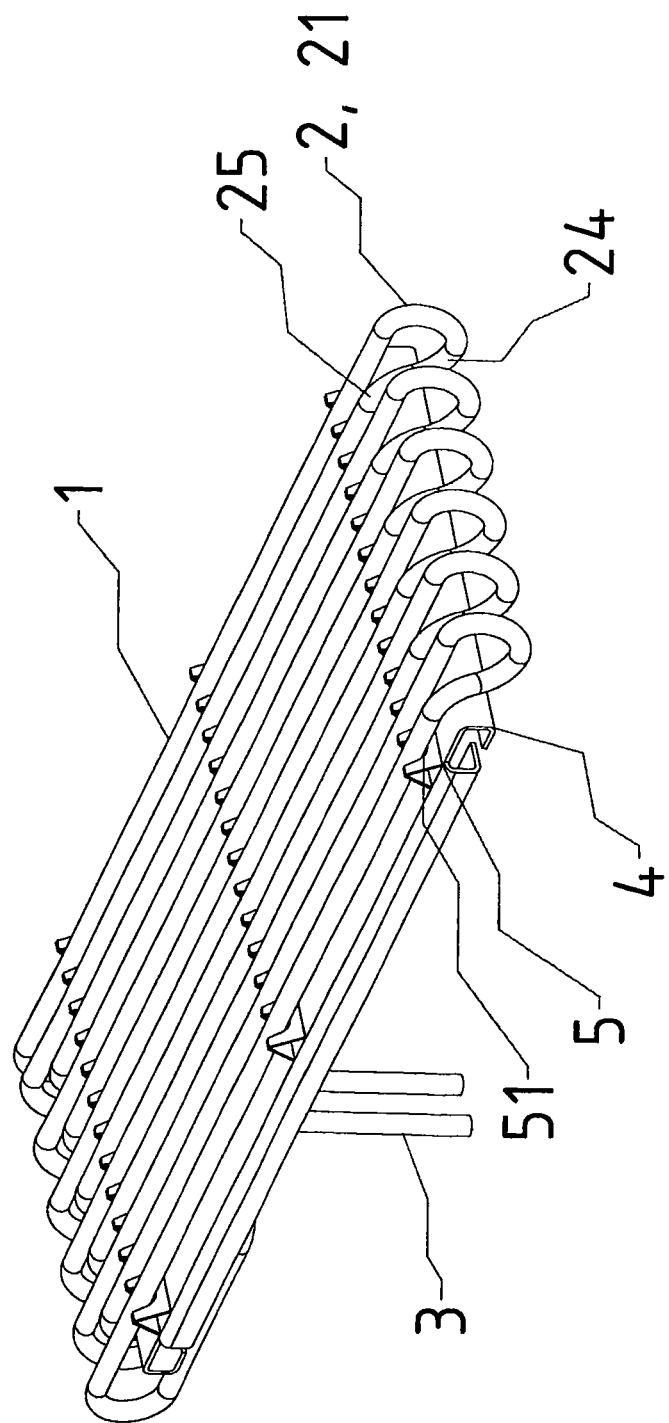

SURFACE HEATING DEVICE FOR A SUBSTRATE TREATMENT DEVICE AND SUBSTRATE TREATMENT DEVICE

CROSS REFERENCE TO RELATED APPLICATIONS

This application is a national stage filing under section 371 of International Application No. PCT/EP2010/062264 filed on Aug. 23, 2010, and published in German on Feb. 24, 2011 as WO 2011/020924 and claims priority of German application No. 10 2009 038 341.7 filed on Aug. 21, 2009, the entire disclosure of these applications being hereby incorporated herein by reference.

The invention concerns a surface heating device for a substrate treatment device, and a substrate treatment device.

BACKGROUND ART

In the treatment of substrates, for example, coating or diffusion treatment of flat substrates to produce coated glass panes or thin-layer solar cells, the substrates must be heated. Surface heating devices are known for this purpose in which a so-called jacket tube heater is used.

Jacket tube heaters have a resistance heating wire in a jacket tube made of aluminum, stainless steel or other metallic material, which is electrically insulated relative to the jacket tube, for example, embedded in ceramic insulation elements made of aluminum oxide or other appropriate substances.

It is important to achieve the most uniform possible heating of the substrate. Surface heating devices in which one or more jacket tube heaters are shaped so that straight and bent tube sections alternate, the straight tube sections running parallel to each other in a plane, referred to subsequently as main plane, are therefore used in so-called continuous installations for treatment of wafer-like substrates. Each two adjacent straight tube sections are connected to each other on the edge of the surface heating device by a bent tube section, which also lies in the main plane. The surface heating device is arranged in the substrate treatment device generally so that the main plane is aligned parallel to the transport plane of the substrates, the straight tube sections of the jacket tube heater generally being aligned across the transport direction of substrates.

A surface heating device is to be understood subsequently to mean a heating device in which three or more straight tube sections, which are electrically connected in series and are electrically heatable by common current connections, are arranged in the same plane subsequently called the main plane and in which each two adjacent straight tube sections are connected to each other by a bent tube section. Owing to the fact that the straight tube sections are arranged parallel to each other in the same plane, such a surface heating device radiates the heat energy generated by it mostly perpendicular to the main plane.

This is a critical difference relative to heating devices that generate heat energy essentially point-like and therefore radiate uniformly to all sides, like the device described in JP 09236268 A, or radiate the heat along a circular line, like the device known from U.S. Pat. No. 2,483,839.

On the other hand, a heating element is known from U.S. Pat. No. 4,079,921 in which a straight tube section lying in the main plane is connected to two straight tube sections lying in a secondary plane by bent tube sections, but each straight tube section lying in the main plane here has its own power supply and only by corresponding arrangement of numerous such heating elements is a surface device produced in which the numerous straight tube sections lying in the same main plane form a surface heating device. A shortcoming in this solution is, for example, that numerous current connections are required, but also that the straight tube sections lying in the secondary plane are unavoidable, regardless of whether their heating power is required or not.

On the other hand, the invention proceeds from a surface heating device in which the three or more straight tube sections generally of essentially the same length, which are electrically heatable by a common power supply, are arranged in the same plane, subsequently called the main plane, and in which each two adjacent straight tube sections are connected to each other by a bent tube section. In other words, the heating wires or sections of a heating wire that are passed through the straight tube sections are connected electrically in series and are fed by common current connections that are arranged on each end of the configuration of straight and bent tube sections.

To produce such surface heating devices the jacket tube heater must therefore be bent repeatedly in order to obtain the bent tube sections, which connect the straight tube sections to each other. There is a restriction in that the bending radii of the bent tube sections cannot be chosen arbitrarily small. Depending on the diameter, wall thickness and material of the jacket tube, the bending radius must not be smaller than the stipulated minimum radius. This results in the difficulty that the straight tube sections cannot be arranged arbitrarily close to each other, for which reason the power density of the surface heating device has limits. The homogeneity of heat input into the substrate underneath also suffers in that the straight tube sections have a minimum spacing dictated by the minimum radius.

The invention is supposed to create a remedy here in which the power density is increased and the homogeneity of heat radiation improved.

BRIEF SUMMARY OF INVENTION

It is proposed in a surface heating device for a substrate treatment device for mostly surface radiation of heat perpendicular to a main plane, which includes a jacket tube heater with at least three straight tube sections and bent tube sections arranged parallel to each other in a common plane and electrically heatable by means of a resistance heating wire via two common current connections arranged on both ends of the jacket tube, in which at least two straight tube sections are arranged parallel to each other in a main plane and are connected to each other on their ends with at least one other straight tube section by bent tube sections, that at least part of the bent tube sections is aligned sloped relative to the main plane.

Through this expedient it is possible to arrange straight tube sections of the jacket tube heater in the main plane with a smaller spacing relative to each other than would be possible in ordinary jacket tube heaters based on the minimum bending radius. Different configurations are possible for this, three variants of which are further described below.

The first variant leads to a jacket tube heater in which, as in the known surface heating devices, all straight tube sections are arranged in the main plane but with a smaller spacing than in the known surface heating devices. The second variant, on the other hand, leads to a jacket tube heater in which some of the straight tube sections are arranged in the main plane and other straight tube sections are arranged in a secondary plane. Already on this account the straight tube sections can be arranged at a smaller spacing than in the known surface heating devices if one straight tube section arranged in the secondary plane lies between two straight tube sections arranged next to each other in the main plane.

The first variant is achieved in that a first bent tube section includes three half-circles in which a first half-circle starting from a first end of a first straight tube section leads from the main plane into a parallel secondary plane and there grades into a second half-circle that lies in the secondary plane and the second half-circle grades into a third half-circle that leads back to the main plane from the secondary plane and there grades into a first end of a second straight tube section.

A half-circle is then to be understood to mean an arc whose end cross sections run parallel to each other. An example of a half-circle in this sense is a semicircular arc, but other arc forms that have an irregular shape are also embraced by the term.

The first and third half-circles can then be aligned perpendicular or at a different angle to the main plane. The slope angle also determines which distance is achieved between two adjacent straight tube sections of the jacket tube heater. In other words, the spacing of the two adjacent straight tube sections can be adjusted by the fact that the slope angle of the first and third half-circle is varied. Very limited spacings of adjacent straight tube sections can then be achieved, but it is also possible to set larger spacings if the first and third half-circles are sloped opposite the bent tube sections.

In a modification of the first variant it is proposed that a second bent tube section include three half-circles, in which a first half-circle starting from the second end of the second straight tube section leads from the main plane into the secondary plane and there grades into a second half-circle that lies in the secondary plane and the second half-circle grades into a third half-circle that leads back to the main plane from the secondary plane and there grades into a second end of a third straight tube section.

Through alternating arrangement of the described bent tube sections, each of which includes three half-circles, it is possible to arrange any number of straight tube sections parallel to each other in the main plane.

The second variant is achieved by the fact that a first bent tube section includes a half-circle, which, starting from a first end of a first straight tube section leads into a parallel secondary plane from the main plane and there grades into the first end of a second straight tube section that lies in the secondary plane.

In contrast to the first variant the straight tube sections here are arranged alternating in the main plane and the secondary plane parallel to it. In this variant production is much simpler because only one bending step need be conducted between two adjacent straight tube sections. The homogeneity of heat radiation is higher than in known surface heating devices because one straight tube section of the secondary plane is arranged between every two adjacent straight tube sections of the main plane. The straight tube sections of both the main plane and the secondary plane can be arranged arbitrarily closely to each other in this way, in the limiting case even so that adjacent straight tube sections touch in the same plane.

The second variant is also particularly suitable if two-sided heat radiation is desired because the main plane and the secondary plane are equivalent. A heat insulation element for thermal separation or/and one or more reflectors for directed heat radiation can optionally be arranged between the main and secondary plane.

In a modification of the first variant it is provided that a second bent tube section includes a half-circle which, starting from the second end of the second straight tube section leads into the main plane from the secondary plane and there grades into the second end of a third straight tube section that lies in the main plane.

Through alternating arrangement of the described bent tube sections, each of which includes a half-circle, it is possible to arrange any number of straight tube sections parallel to each other in the main plane and secondary plane.

The third variant is achieved by the fact that a first bent tube section includes a half-circle and two quarter-circles in which the half-circle, starting from a first end of a first straight tube section leads from the main plane into a parallel secondary plane and there grades into a first quarter-circle and the first quarter-circle grades into a second quarter-circle, in which the first quarter-circle and the second quarter-circle together lead back into the main plane from the secondary plane and the second quarter-circle grades there into a first end of a second straight tube section.

A quarter-circle is then to be understood to mean an arc whose end cross sections run at right angles to each other. An example of a quarter-circle in this sense is a quarter circle arc, but other arc forms that have an irregular shape are embraced by the term.

As in the first variant, the straight tube sections here are arranged exclusively in the main plane. The configuration of the bent tube sections from a half-circle and two quarter-circles can be implemented with limited material use.

In a modification of the third variant it is proposed that a second bent tube section include two quarter-circles and a half-circle, in which a first quarter-circle, starting from the second end of the second straight tube section, leads from the main plane and grades into a first quarter-circle, which leads to the secondary plane and there grades into the half-circle and the half-circle leads back from the secondary plane into the main plane and there grades into a second end of a third straight tube section.

It can be provided in another embodiment that at least one jacket tube heater is arranged on at least one support structure, which is arranged on a carrier structure.

The carrier structure can then be designed plate-like or/and as a heat insulation element or/and as a reflector. The carrier structure can also be arranged so that the entire jacket tube heater is situated on one side of the carrier structure or that part of the tube sections of the jacket tube heater are situated on each side of this carrier structure.

The support structure can be a shaped sheet metal part, for example, having recesses to accommodate straight tube sections of the jacket tube heater. This configuration permits reliable fastening of the jacket tube heater with limited weight of the support structure and at the same time compensation for heat expansion of the jacket tube heater.

In another embodiment it can be provided that the current connections to the jacket tube heater be arranged on the side of the carrier structure opposite the jacket tube heater.

The described surface heating device can advantageously be used in a substrate treatment device that includes a chamber and at least one substrate treatment device, as well as a transport device to transport substrates through the chamber, at least one of the described surface heating devices being arranged in the chamber.

A substrate treatment device in this sense can be, for example, a coating or ablation device or a diffusion zone.

The transport device can include an arrangement of parallel transport rolls or transport rollers for plate-like substrates or substrate holders, which define a transport plane for the substrates and the surface heating device is arranged so that the main plane is aligned parallel to the transport plane.

For installations for horizontal substrate treatment the uppermost surface lines of horizontally arranged transport rolls on which the substrates are placed with or without substrate holders define a horizontal transport plane. For installations for vertical substrate treatment the transport rolls on which the substrates are placed with or without substrate holders perpendicular or at a slight sloping angle, generally in cooperation with support rolls in order to prevent tilting of the substrates, define a vertical transport plane or one sloped relative to the vertical by the slope angle.

In one embodiment of the substrate treatment device it is provided that straight tube sections of the jacket tube heater are arranged perpendicular to the transport direction of the substrates. A particularly homogeneous heat input into the substrates is achieved on this account.

BRIEF DESCRIPTION OF DRAWING FIGURES

The proposed surface heating device is further explained below with reference to two practical examples and the corresponding drawings.

In the drawings

FIG. 6 shows the third practical example in a perspective view.

DETAILED DESCRIPTION

Figure 1:
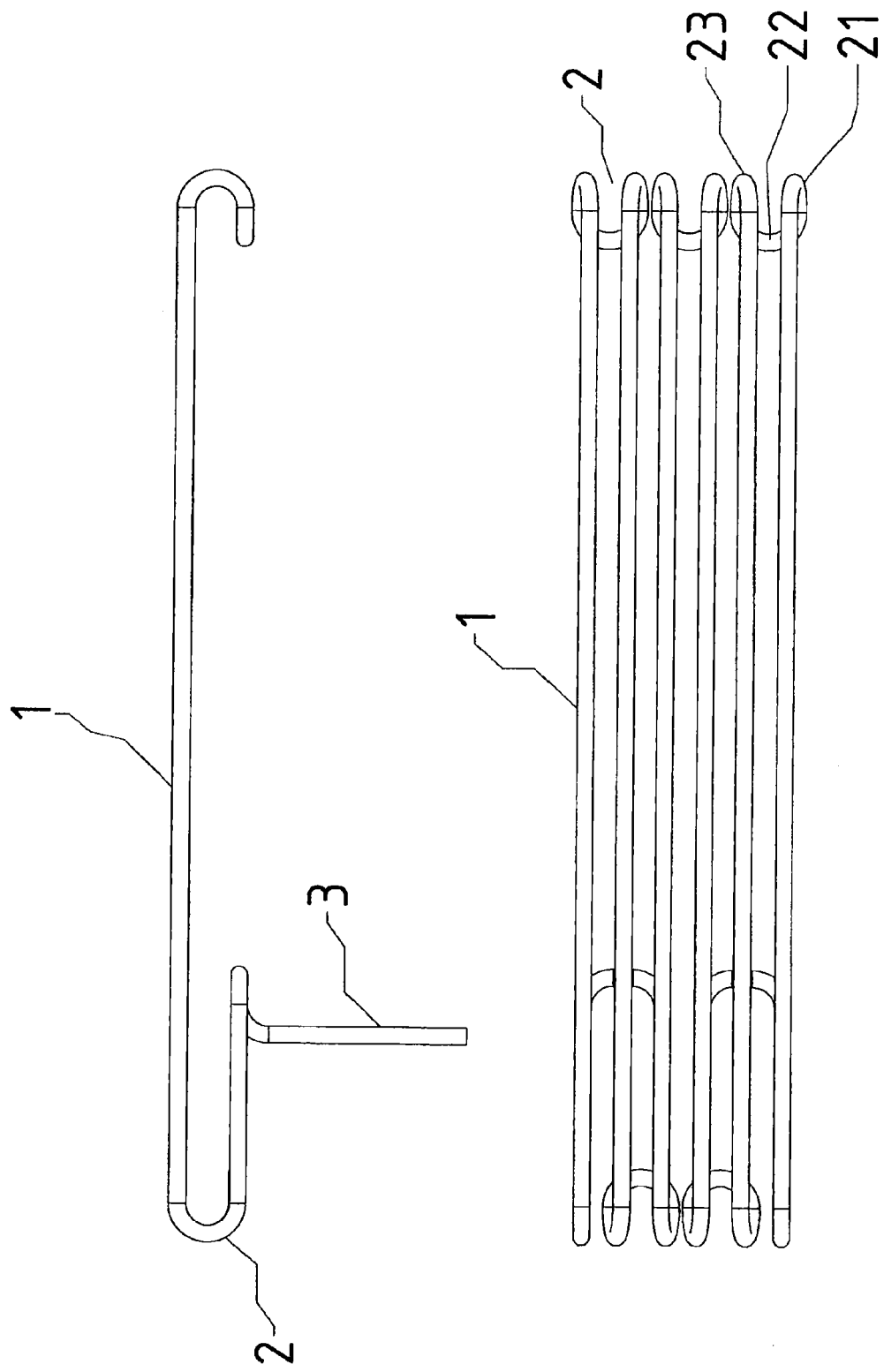
FIG. 1 shows the first practical example in a side view and top view.
Figure 2:
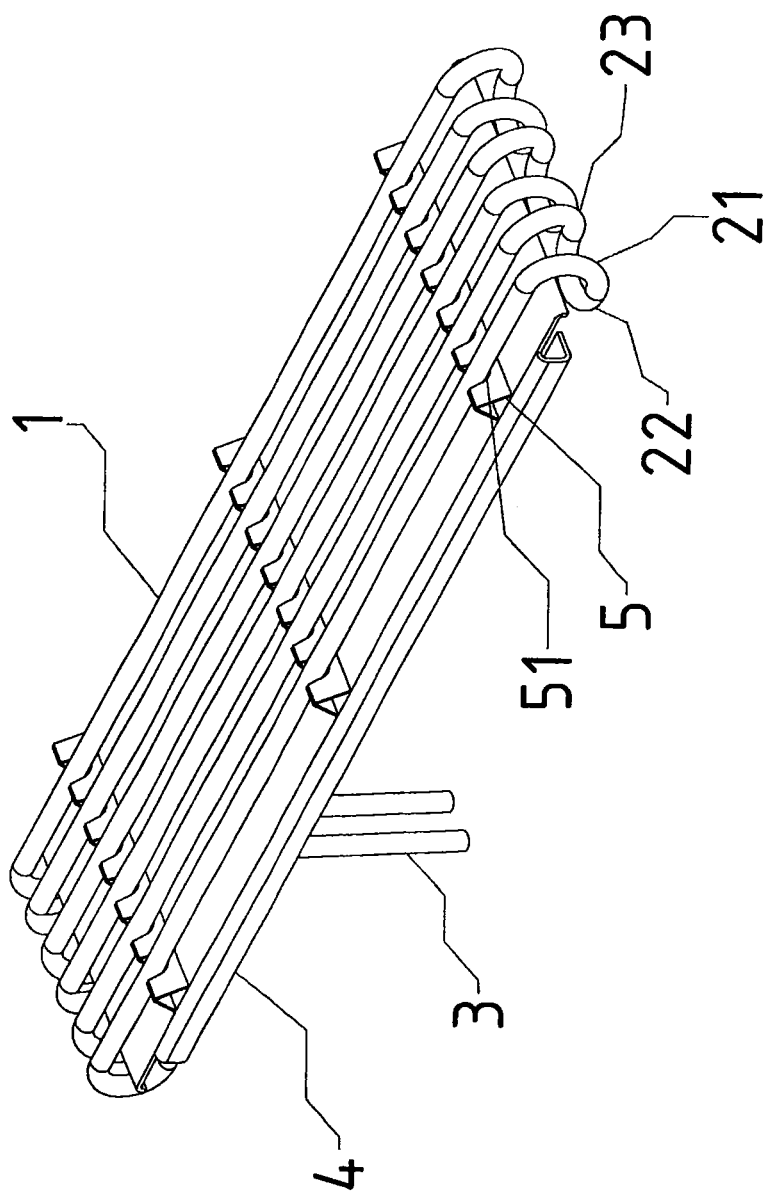
FIG. 2 shows the first practical example in a perspective view.

All straight tube sections 1 of the jacket tube heater in the practical example of FIGS. 1 and 2 are situated in the main plane where they are arranged with a defined spacing relative to each other. This spacing is less than double the minimum radius to be maintained during bending of the jacket tube heater.

This is achieved in that the bent tube sections 2 arranged on the ends of the straight tube sections 1 each have a first half-circle 21, a second half-circle 22 and a third half-circle 23. The first half-circle 21 and the third half-circle 23 are connected to a straight tube section 1 of the jacket tube heater and sloped relative to the main plane. The second half-circle 22 lies in the secondary plane parallel to the main plane and connects the first half-circle 21 to the third half-circle 23. Although the ends of all three half-circles 21, 22, 23 each have a spacing relative to each other corresponding to double the minimum radius, the straight tube sections 1 are arranged with a spacing relative to each other that is less than double the minimum radius. This is achieved by the fact that the first half-circle and the third half-circle are now aligned perpendicular to the main plane.

An essentially plate-like carrier structure 4 is also provided on which two support structures 5 designed as shaped sheet metal parts are arranged with recesses 51. The current connections 3 of the jacket tube heater are arranged on the side of the carrier structure 4 opposite the jacket tube heater.

Figure 3:
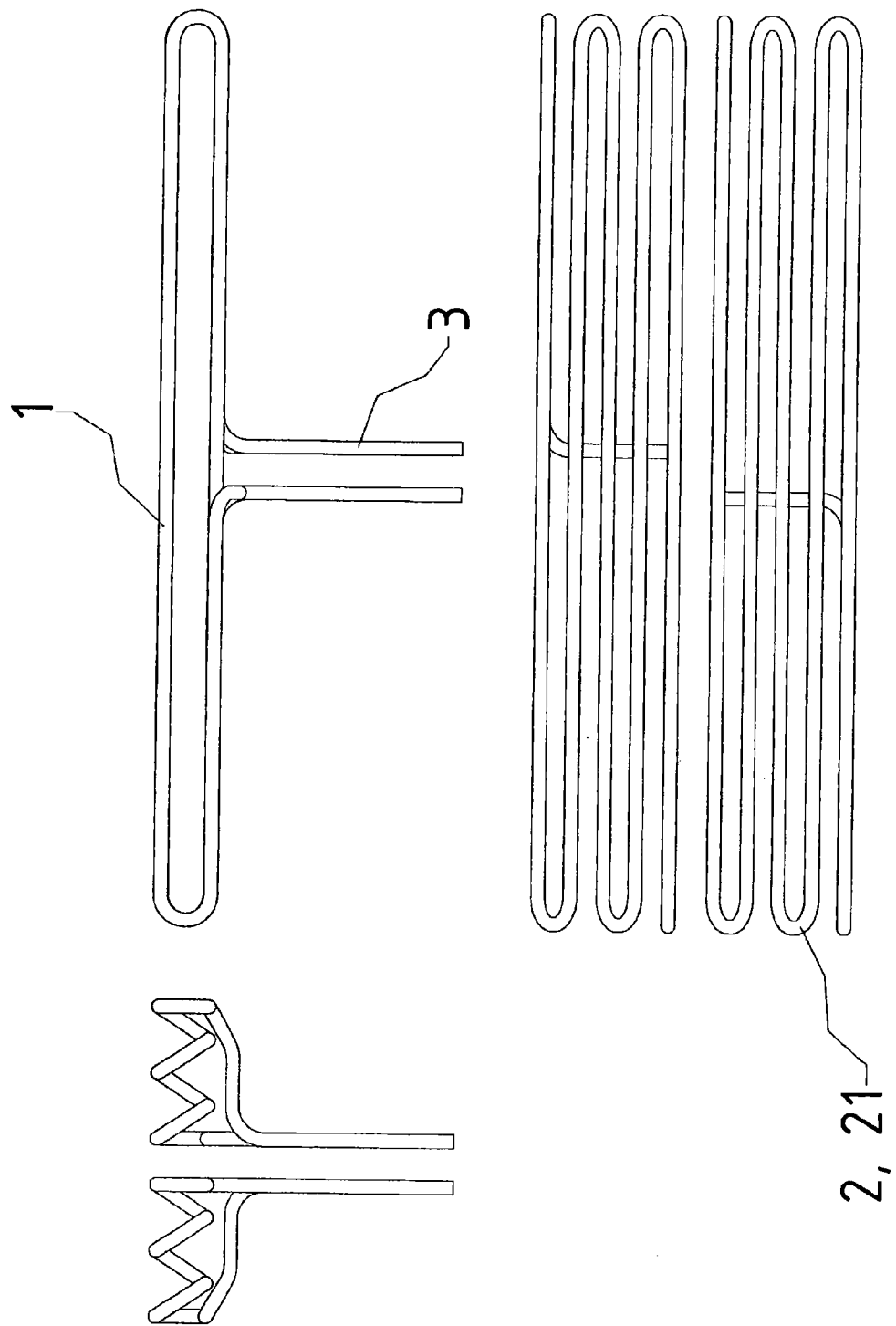
FIG. 3 shows the second practical example in a side view and top view.
Figure 4:
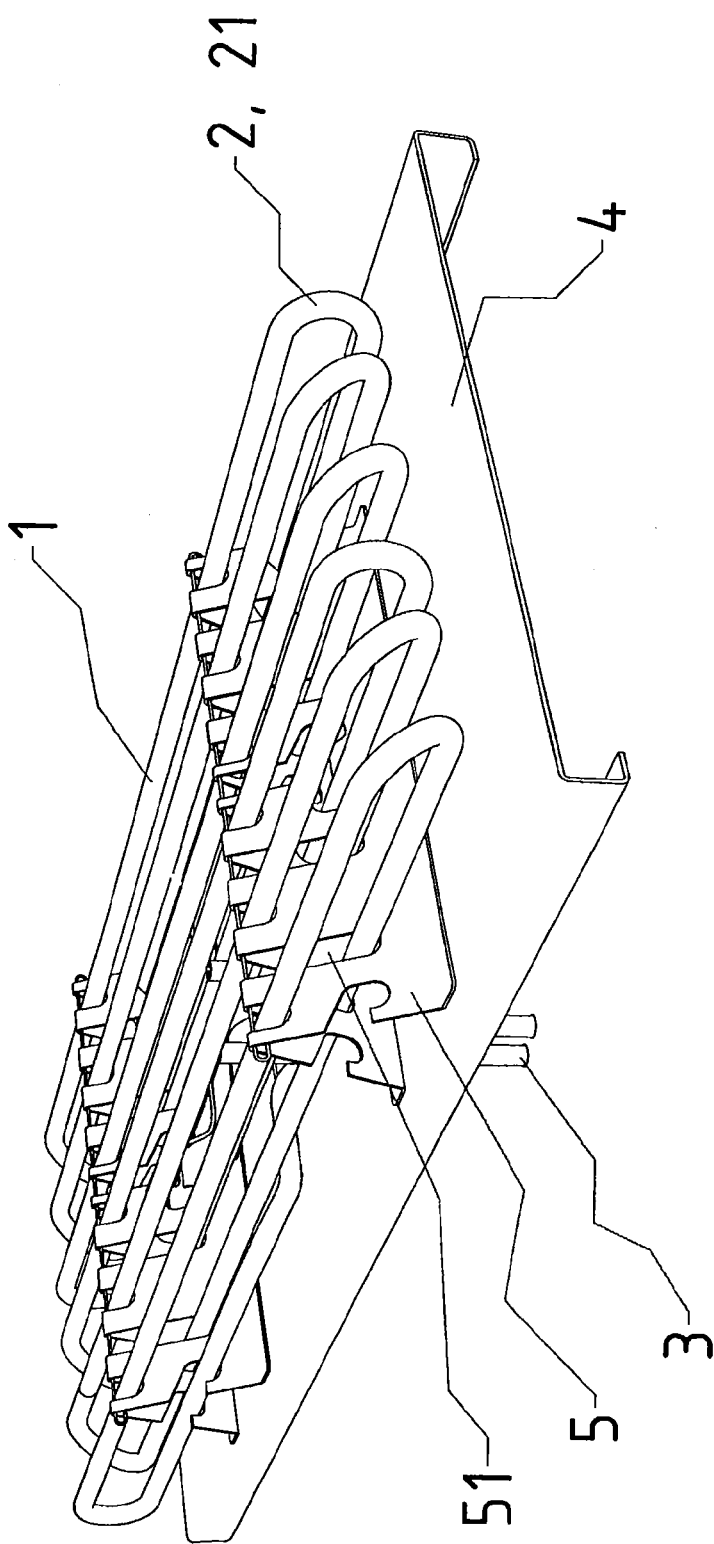
FIG. 4 shows the second practical example in a perspective view.

In the practical example of FIGS. 3 and 4 some straight tube sections 1 of the jacket tube heater are arranged in the main plane and some straight tube sections 1 of the jacket tube heater are arranged in the secondary plane, where they have a defined spacing relative to each other, in which one straight tube section 1 in the secondary plane is arranged between two straight tube sections 1 in the main plane. This spacing is smaller than twice the minimum radius to be maintained during bending of the jacket tube heater.

This is achieved in that the bent tube sections 2 joining the two ends of the straight tube sections 1 of the main plane and secondary plane each include a first half-circle 21 sloped relative to the main plane. Although the ends of the half-circle 21 each have a spacing relative to each other that corresponds to double the minimum radius, the straight tube sections 1 of the main plane are arranged with a spacing relative to the straight tube sections 1 of the secondary plane with a spacing that is less than twice the minimum radius.

An essentially plate-like carrier structure 4 is also provided on which two support structures 5 designed as shaped sheet metal parts are arranged with recesses 51. The current connections 3 of the jacket tube heater are arranged on the side of the carrier structure 4 opposite the jacket tube heater.

Figure 5:
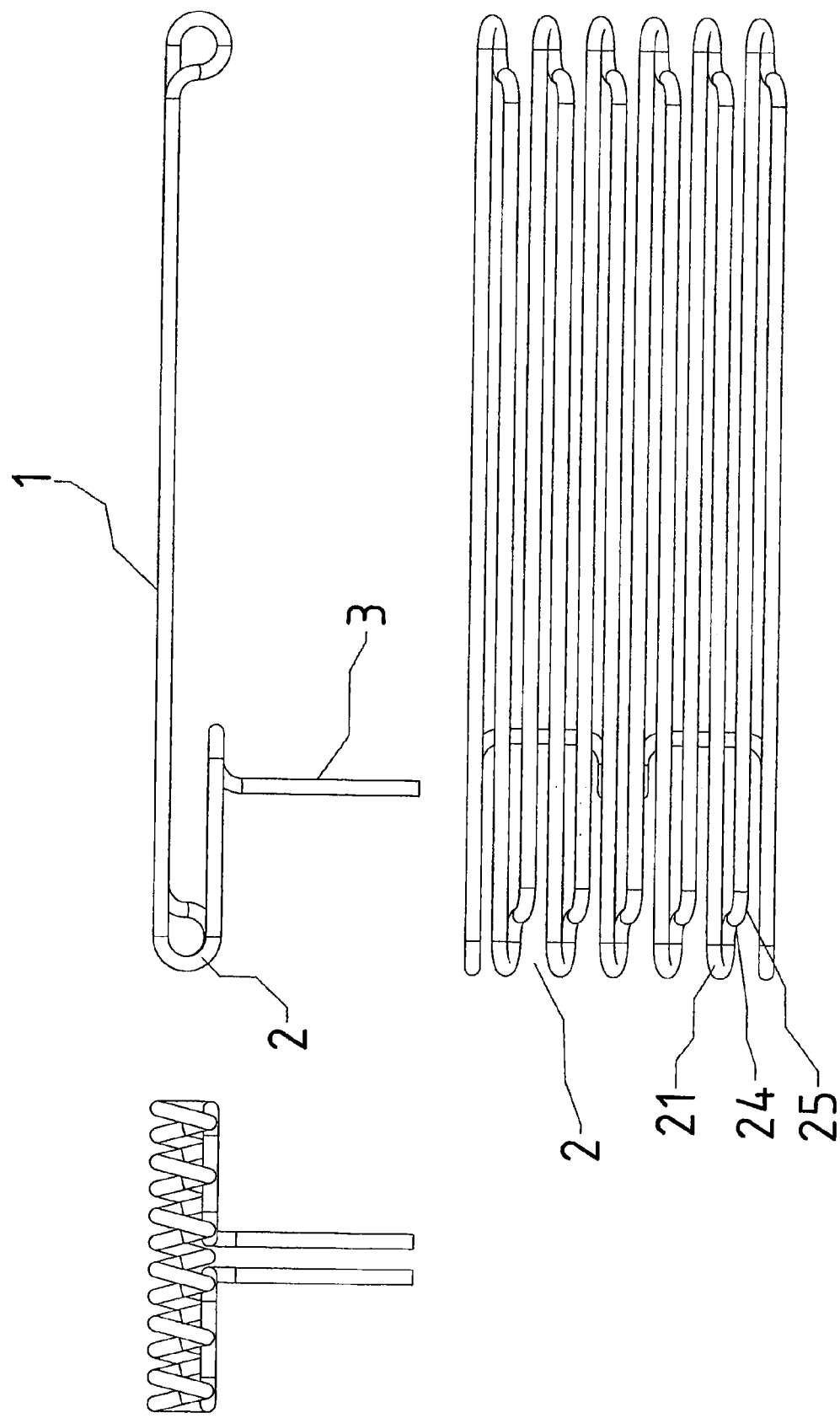
FIG. 5 shows the third practical example in a side view and top view.

In the practical example of FIGS. 5 and 6 all straight tube sections 1 of the jacket tube heater are situated in the main plane where they are arranged with a defined spacing relative to each other. This spacing is less than twice the minimum radius to be maintained during bending of the jacket tube heater.

This is achieved in that the bent tube sections 2 arranged on the ends of the straight tube sections 1 each have a first half-circle 21, a first quarter-circle 24 and a second quarter-circle 25.

The connection between the ends of two adjacent straight tube sections 1 always occurs through a combination of these three elements, in which the half-circle 21 leads from the end of the first straight tube section into the secondary plane and the two quarter-circles 24, 25 together lead from the end of the second straight tube section 1 into the secondary plane where the half-circle grades into a quarter-circle 24.

An essentially plate-like carrier structure 4 is also provided on which two support structures 5 designed as shaped sheet metal parts are arranged with recesses 51. The current connections 3 of the jacket tube heater are arranged on the side of the carrier structure 4 opposite the jacket tube heater.

The invention claimed is:

1. Surface heating device for a substrate treatment device for essentially surface radiation of heat perpendicular to a main plane, comprising a jacket tube heater with at least three straight tube sections arranged in a common plane parallel and equidistant to each other and bent tube sections, electrically heatable by a resistance heating wire via two common current connections arranged on two ends of the jacket tube heater, wherein at least two straight tube sections are arranged parallel to each other in the main plane and have ends connected to each other by bent tube sections with at least one adjacent straight tube section arranged in the main plane or in a parallel secondary plane, and wherein at least part of the bent tube sections is aligned sloped from the main plane; and
wherein a first bent tube section includes three half-circles, in which a first half-circle leads from a first end of a first straight tube section from the main plane into the parallel secondary plane and there grades into a second half-circle that lies in the secondary plane and the second half-circle grades into a third half-circle that leads back from the secondary plane into the main plane and there grades into a first end of a second straight tube section.

2. Surface heating device according to claim 1, wherein a second bent tube section includes three half-circles, in which a first half-circle starting from a second end of the second straight tube section leads from the main plane into a secondary plane and there grades into a second half-circle that lies in the secondary plane and the second half-circle grades into a third half-circle that leads back from the secondary plane into the main plane and there grades into a second end of a third straight tube section.

3. Surface heating device according to claim 1, wherein the jacket tube heater is arranged on at least one support structure arranged on a carrier structure.

4. Surface heating device according to claim 3, wherein the carrier structure is plate shaped.

5. Surface heating device according to claim 3, wherein the support structure is a shaped sheet metal part having recesses to accommodate straight tube sections of the jacket tube heater.

6. Surface heating device according to claim 3, wherein the current connections of the jacket tube heater are arranged on a side of the carrier structure opposite the jacket tube heater.

7. Surface treatment device comprising a chamber and at least one substrate treatment device, as well as a transport device to transport substrates through the chamber, wherein at least one surface heating device according to claim 1 is arranged in the chamber.

8. Surface treatment device according to claim 7, wherein the transport device includes an arrangement of parallel transport rolls or transport rollers for plate-like substrates or substrate holders, which define a transport plane for the substrates and the surface heating device is arranged so that the main plane is aligned parallel to the transport plane.

9. Surface treatment device according to claim 7, wherein straight tube sections of the jacket tube heater are arranged perpendicular to a transport direction of the substrates.

10. Surface heating device for a substrate treatment device for essentially surface radiation of heat perpendicular to a main plane, comprising a jacket tube heater with at least three straight tube sections arranged in a common plane parallel and equidistant to each other and bent tube sections, electrically heatable by a resistance heating wire via two common current connections arranged on two ends of the jacket tube heater, wherein at least two straight tube sections are arranged parallel to each other in the main plane and have ends connected to each other by bend tube sections with at least one adjacent straight tube section arranged in the main plane or in a parallel secondary plane, and wherein at least part of the bent tube sections is aligned sloped from the main plane, and
    wherein a first bent tube section includes a half-circle and two quarter-circles, in which the half-circle, starting from a first end of a first straight tube section leads from the main plane into the parallel secondary plane and there grades into a first quarter-circle and the first quarter-circle grades into a second quarter-circle, in which the first quarter-circle and the second quarter-circle together lead back from the secondary plane into the main plane and the second quarter-circle there grades into a first end of a second straight tube section.

11. Surface heating device according to claim 10, wherein a second bent tube section includes two quarter-circles and a half-circle, in which a second quarter-circle, starting from a second end of the second straight tube section, leads from the main plane and grades into a first quarter-circle that leads into the secondary plane and grades there into the half-circle and the half-circle leads back from the secondary plane into the main plane and there grades into a second end of a third straight tube section.

12. Surface heating device according to claim 10, wherein the jacket tube heater is arranged on at least one support structure arranged on a carrier structure.

13. Surface heating device according to claim 12, wherein the carrier structure is plate shaped.

14. Surface heating device according to claim 12, wherein the support structure is a shaped sheet metal part having recesses to accommodate straight tube sections of the jacket tube heater.

15. Surface heating device according to claim 12, wherein the current connections of the jacket tube heater are arranged on a side of the carrier structure opposite the jacket tube heater.

16. Surface treatment device comprising a chamber and at least one substrate treatment device, as well as a transport device to transport substrates through the chamber, wherein at least one surface heating device according to claim 10 is arranged in the chamber.

17. Surface treatment device according to claim 16, wherein the transport device includes an arrangement of parallel transport rolls or transport rollers for plate-like substrates or substrate holders, which define a transport plane for the substrates and the surface heating device is arranged so that the main plane is aligned parallel to the transport plane.

18. Surface treatment device according to claim 16, wherein straight tube sections of the jacket tube heater are arranged perpendicular to a transport direction of the substrates.

* * * * *